United States Patent [19]

Verhoeven et al.

[11] Patent Number: 4,758,796

[45] Date of Patent: Jul. 19, 1988

[54] BRIDGE AMPLIFIER OPERATING FROM AN ASYMMETRICAL POWER SUPPLY

[75] Inventors: Bernardus Verhoeven; Martinus J. van den Bungelaar, both of Nijmegen, Netherlands

[73] Assignee: U.S. Philips Corporation, New York, N.Y.

[21] Appl. No.: 7,297

[22] Filed: Jan. 27, 1987

[30] Foreign Application Priority Data

Feb. 7, 1986 [NL] Netherlands .................. 8600292

[51] Int. Cl.$^4$ ............................................. H03F 3/68
[52] U.S. Cl. .................................... 330/84; 330/146; 330/260; 330/295
[58] Field of Search ............... 330/84, 146, 260, 273, 330/295

[56] References Cited

U.S. PATENT DOCUMENTS 4,539,529 9/1985 Lenz ............................ 330/84 X

*Primary Examiner*—James B. Mullins
*Attorney, Agent, or Firm*—Thomas A. Briody; Algy Tamoshunas; Marianne R. Rich

[57] ABSTRACT

A fully integratable bridge amplifier comprises two identical amplifiers (1; 5) each being provided with a first input stage (20; 40) whose inputs constitute the first non-inverting inputs (2; 6) and the first inverting inputs (3; 7) of the amplifier, a second input stage (29; 50) whose inputs constitute the second non-inverting inputs (28; 49) and the second inverting inputs (27; 48) of the amplifier, and an output stage (25; 45). The first inverting input (3; 7) of each amplifier (1; 5) is connected to the output (12) of a buffer amplifier (9) via a first resistor ($R_6$; $R_9$) which together with a second resistor ($R_5$; $R_8$) constitutes a negative feedback network between the output (4; 8) of the amplifier (1; 5) and the first inverting input (3; 7). The first non-inverting input (2; 6) is also connected to the output (12) of the buffer amplifier (9). This output (12) and consequently the first inputs (2, 3; 6, 7) of the amplifiers (1; 5) are at half the supply voltage with respect to the d.c. voltage, which is obtained by voltage division ($R_2$, $R_3$) of the supply voltage between the positive supply terminal (15) and ground terminal (16), while with respect to the signals this output (12) constitutes a virtual ground connection. The second non-inverting inputs (28; 49) and inverting inputs (27; 48) are at a reference voltage ($V_{ref}$) with respect to the d.c. voltage. The input voltage $V_i$ is directly applied to the second non-inverting input (28) of the first amplifier (1) and the second inverting input (48) of the second amplifier.

5 Claims, 2 Drawing Sheets

BRIDGE AMPLIFIER OPERATING FROM AN ASYMMETRICAL POWER SUPPLY

The invention relates to a bridge amplifier connected between two connection terminals of an asymmetrical supply voltage.

A voltage divider having a tap for taking off substantially half the supply voltage.

A first amplifier for amplifying an input signal, comprises a first non-inverting input which is coupled to the tap on the voltage divider, a first inverting input and an output for connecting a first connection terminal of a load, said output being fed back by a resistor to the first inverting input.

A second amplifier amplifies the input signal, comprising a first non-inverting input which is coupled to the tap on the voltage divider, a first inverting input and an output for connecting a second connection terminal of the load, said output being fed back by a resistor to the first inverting input.

A bridge amplifier of this type is suitable for amplifying audio signals and may be particularly used in car radios.

A bridge amplifier of this type is known from the Philips Data Handbook Integrated Circuits Part 1, March 1984, "Bipolar IC's for radio and audio equipment", page 310. The first amplifier is a non-inverting negative feedback amplifier in which the input voltage to be amplified is applied to the non-inverting input and in which a fraction of the output voltage is fed back to the inverting input via a voltage divider arranged between the output and ground. Furthermore, the non-inverting input is connected to the tap on a voltage divider arranged between the supply connection points and is therefore at half the supply voltage with respect to the d.c. voltage. The inverting input and the output are also at this half supply voltage because the amplifier is completely negatively fed back with respect to the d.c. voltage by a capacitor incorporated in the voltage divider between the output and ground. The second amplifier constitutes an inverting amplifier in which a fraction of the output voltage of the first amplifier is applied to the inverting input of the second amplifier. Otherwise, the second amplifier is formed similarly as the first amplifier, whilst the capacitor for the direct voltage negative feedback is combined with that of the first amplifier to form a common capacitor. This capacitor is a non-integratable electrolytic capacitor. The tap on the voltage divider arranged between the supply terminals is connected to ground via a likewise non-integratable electrolytic capacitor in order to suppress the hum voltage of the supply voltage. In principle this capacitor may be omitted because in that case the amplified hum voltage appears at the output of both the first and the second amplifier and consequently does not cause a signal current through the load. In principle it is also possible to omit the capacitor for the direct voltage negative feedback and to connect the ends of the voltage dividers for the signal negative feedback to the tap on the voltage divider arranged between the supply terminals. In that case the capacitor connected to this tap cannot be omitted, because otherwise the negative feedback factor and hence the amplification is no longer accuratley fixed.

. Therefore, the known bridge amplifier requires at least one non-integratable capacitor.

SUMMARY OF THE INVENTION

It is therefore an object of the invention to provide a bridge amplifier which is fully integratable and thus does not require any external components. According to the invention, a bridge amplifier of the type described in the opening paragraph is characterized in that at least the first inverting input of the first amplifier and the first inverting input of the second amplifier are coupled to an output of a buffer amplifier, an input of which is coupled to the tap on the voltage divider. As is known per se, a buffer amplifier has a voltage gain which is substantially equal to one and its output impedance is substantially equal to zero so that the output of the buffer amplifier is at half the supply voltage with respect to the direct voltage, whilst this output constitutes a virtual earth point with respect to the signal. Consequently, the ends of the voltage dividers used for the negative feedback can be connected via the buffer amplifier to the tap on the voltage divider arranged between the supply terminals without this tap having to be connected to ground via a capacitor. The bridge amplifier according to the invention is thereby fully integratable.

The first non-inverting inputs of the first and the second amplifier may be connected directly or via the buffer amplifier to the tap on the voltage divider arranged between the supply terminals.

An embodiment of a bridge amplifier according to the invention is characterized in that the first non-inverting input of the first amplifier constitutes the input for supplying the input signal. This embodiment may be further characterized in that the first inverting input of the second amplifier is coupled to a tap on a voltage divider arranged across the output of the first amplifier. In addition it is also possible to apply the input voltage directly to the first non-inverting input of the second amplifier via a voltage inverter circuit.

A further embodiment of a bridge amplifier according to the invention is characterized in that the first amplifier comprises:

a first input stage having a first input constituting the first non-inverting input of the amplifier, a second input constituting the first inverting input of the amplifier, and an output connected to the input of an output stage having two output constituting the output of the first amplifier,and a second input stage having a first input constituting a second non-inverting input of the first amplifier, a second input constituting a second inverting input of the first amplifier, and an output connected to the input of the output stage.

The second amplifier comprises:

a third input stage having a first input constituting the first non-inverting input of the second amplifier, a second input constituting the first inverting input of the second amplifier, and an output connected to the input of an output stage having an output constituting the output of the second amplifier, and a fourth input stage having a first input constituting a second non-inverting input of the second amplifier, a second input constituting a second inverting input of the second amplifier, and an output connected to the input of the output stage.

The second non-inverting input of the first amplifier and the second inverting input of the second amplifier are coupled to a connection point for applying an input signal.

The second inverting input and the second non-inverting input of both the first and the second amplifier are coupled to a connection point for carrying a reference potential. By causing the negative feedback of the first and the second amplifier to be effected via separate input stages, the input voltage cannot only be applied directly to the second non-inverting input of the first amplifier, but also directly to the second inverting input of the second amplifier. This prevents the output signal from being distorted as in the case when the input voltage is applied via a voltage inverter circuit to the first non-inverting input or in the case when the input voltage is applied via a voltage divider connected to the output of the first amplifier to the first inverting input of the second amplifier.

In the case when the first, second, third and fourth input stages are each constituted by a differential amplifier having a differential-to-single-ended converter, this embodiment may be further characterized in that the first and the second input stage comprise a common differential-to-single-ended converter and the third and the fourth input stage comprises a common differential-to-single-ended converter.

The invention will be further described with reference to the accompanying drawings;

DESCRIPTION OF THE PREFERRED EMBODIMENT

Figure 1:
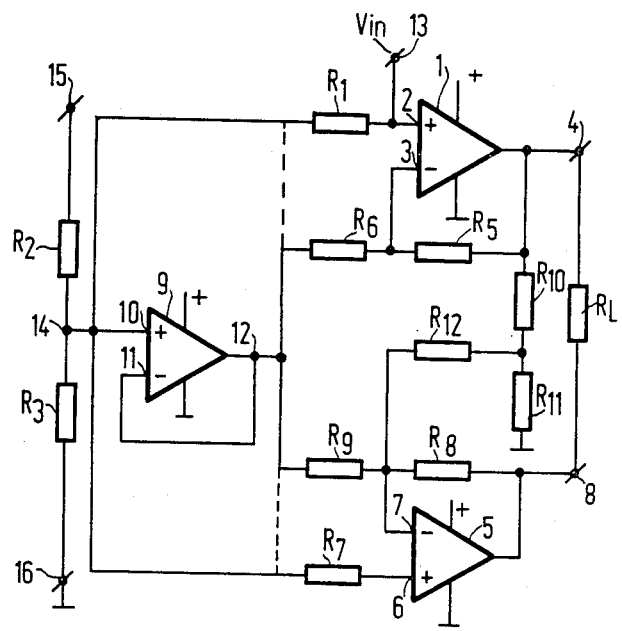
FIG. 1 shows a first embodiment of a bridge amplifier according to the invention.

FIG. 1 shows a first embodiment of a bridge amplifier according to the invention. The bridge amplifier comprises a first amplifier 1 having a non-inverting input 2, an inverting input 3 and an output 4. The non-inverting input 2 is connected by an input resistor $R_1$ to the tap 14 on a voltage divider having mutually equal resistors $R_2$ and $R_3$ arranged between the positive supply voltage terminal 15 and the ground terminal 16. Consequently, the non-inverting input 2 is at substantially half the supply voltage. The inverting input 3 is connected to the junction point on a voltage divider constituted by the resistors $R_5$ and $R_6$ and being arranged between the output 4 and the output 12 of a buffer amplifier 9. The non-inverting input 10 of this buffer amplifier 9 is connected to the tap 14 on the voltage divider $R_2$, $R_3$. The inverting input 11 is connected to the output 12 so that amplifier 9 is fully negatively fed back and thus constitutes a voltage follower. The voltage at the output 12 and consequently the voltage at the inverting input 3 of amplifier 1 is therefore substantially equal to half the suppl voltage. With respect to d.c. voltage the non-inverting input 2, the inverting input 3 and hence also the output 4 are thus at half the supply voltage. With respect to the signals the first amplifier constitutues a non-inverting amplifier because the input voltage to be amplified is applied to an input terminal 13 which is connected to the non-inverting input 3. Due to the full negative feedback, the output impedance of the buffer amplifier 9 is substantially equal to zero so that the output 12 constitutes a virtual earth point with respect to the signals. The negative feedback voltage and consequently the voltage gain of the non-inverting first amplifier 1 is therefore substantially entirely determined by the resistors $R_5$ and $R_6$.

Furthermore, the bridge amplifier comprises a second amplifier 5 which is equal to the first amplifier and has a non-inverting input 6, and inverting input 7 and an output 8. Similarly as in the first amplifier the non-inverting input 6 is connected via a decoupling resistor $R_7$ to the tap on the voltage divider $R_2$, $R_3$ and the inverting input 7 is connected to a tap on a voltage divider constituted by the resistors $R_8$ and $R_9$ and arranged between the output 8 of amplifier 5 and the output 12 of buffer amplifier 9. The non-inverting input 6 and the inverting input 7 are thus likewise at half the supply voltage with respect to the d.c. voltage. With respect to the signals amplifier 5 constitutes an inverting amplifier because the voltage to be amplified is applied to the inverting input 7. Due to the negative feedback with resistors $R_8$ and $R_9$, the inverting input 7 has a low impedance so that the input voltage cannot be applied directly to this input. Therefore, a fraction of the output voltage of the first amplifier 1 obtained with the aid of a voltage divider comprising resistors $R_{10}$ and $R_{11}$ is applied to the inverting input via a resistor $R_{12}$. The load $R_L$ is incorporated between the outputs 4 and 8 of the first and the second amplifier 1 and 5, respectively.

It is to be noted that the non-inverting input 2 of the first amplifier 1 via the resistor $R_1$ and the non-inverting input 6 of the second amplifier 5 via the resistor $R_7$ can also be connected directly to the output 12 of the buffer amplifier 9, as is shown in broken lines in the Figure, instead of to the tap 14 on the voltage divider $R_2$, $R_3$. Furthermore it is to be noted that instead of applying the voltage to be amplified to the inverting input 7 of the second amplifier, it is alternatively possible to apply the input voltage directly to the non-inverting input 6 via a voltage inverter circuit.

The bridge amplifier of FIG. 1 does not require any electroytic capacitors for d.c. biasing as does the known bridge amplifier and can therefore be fully integrated.

Figure 2:
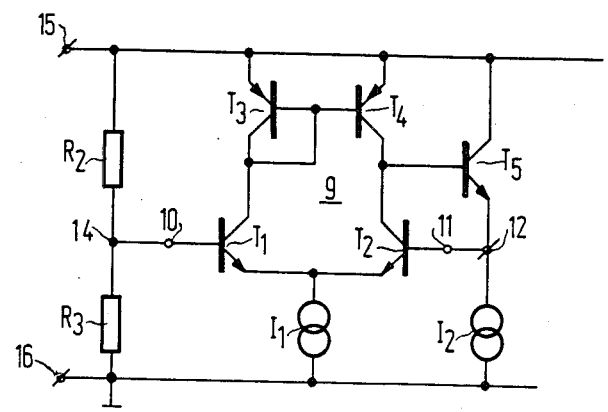
FIG. 2 shows an embodiment of a buffer amplifier for the circuit of FIG. 1.

FIG. 2 shows an embodiment of a buffer amplifier for the circuit of FIG. 1 in which the same components have the same reference numerals. The buffer amplifier 9 is formed by two npn transistors $T_1$ and $T_2$ arranged as different pairs whose common emitter connection is connected to ground via a voltage source $I_1$. The base of transistor $T_1$ constitutes the non-inverting input 10 and the base of transistor $T_2$ constitutes the inverting input 11 of the buffer amplifier. The collector of transistor $T_1$ is connected to the collector of transistor $T_2$ by a current mirror with pnp transistors $T_3$ and $T_4$. Furthermore, this collector is connected to the base of an npn transistor $T_5$ which is arranged as an emitter follower with a current source $I_2$ whose output 12 is connected to the inverting input 11.

It is to be noted that instead of the buffer amplifier shown any other buffer amplifier may be used provided that its voltage gain is substantially equal to one and that the output impedance is substantially equal to zero.

Figure 3:
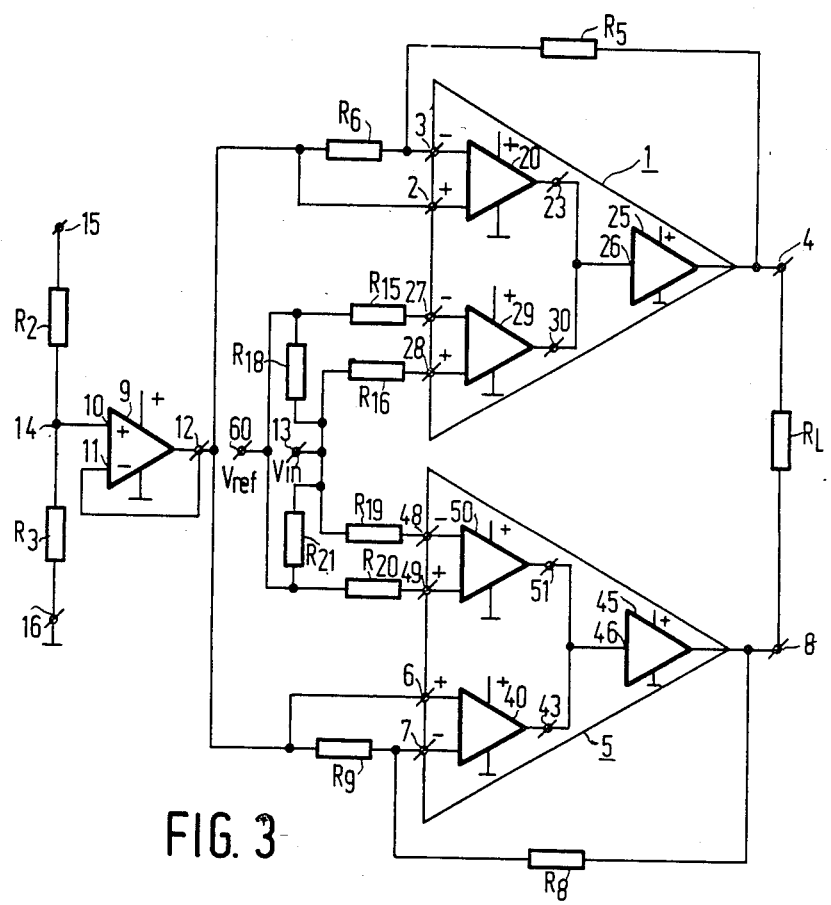
FIG. 3 shows the second embodiment of a bridge amplifier according to the invention.

FIG. 3 shows a second embodiment of a bridge amplifier according to the invention in which the same components have the same reference numerals as those in FIG. 1. In this embodiment the first amplifier 1 is provided with a first input stage 20 having a first input constituting the first non-inverting input 2 of the first amplifier 1, a second input constituting the first inverting input 3 of the first amplifier 1, and an output 23 connected to the input 26 of the output stage 25 whose output 4 is connected by a resistor $R_5$ to the first inverting input 3 which is furthermore connected by a resistor $R_6$ to the output 12 of buffer amplifier 9 which, similarly as in FIG. 1, is connected to the tap 14 on the voltage divider $R_2$, $R_3$. The non-inverting input 2 is connected directly to the output 12 of this buffer amplifier 9. The non-inverting input 2, the inverting input 3 and, as a consequence of the feedback with resistor $R_5$, also the output 4 are therefore at half the supply voltage with respect to the d.c. voltage. The first amplifier 1 also comprises a second input stage 29 which is equal to the first and which has a first input constituting the second non-inverting input 28 of the first amplifier, a second input constituting the second inverting input 27 of the first amplifier, and an output 30 which is connected to the input 26 of the output stage 25. The inverting input 27 is connected by a resistor $R_{15}$ to a terminal 60 carrying a reference voltage $V_{ref}$. The non-inverting input 28 is connected by the series arrangement of a resistor $R_{16}$, which is equal to the resistor $R_{15}$, and a resistor $R_{18}$ to this terminal 60. The inverting input 27 and the noninverting input 28 are at the reference voltage $V_{ref}$ with respect to the d.c. voltage. This voltage may differ from half the supply voltage at the non-inverting input 2 and the inverting input 3 of the first input stage 20. Furthermore the inverting input 28 is connected via the resistor $R_{16}$ to the connection terminal 13 to which the input voltage $V_i$ is applied. The resistor 18 has a resistance which is large relative to that of the resistors $R_{15}$ and $R_{16}$ and consequently functions as an input resistor for the output voltage $V_{in}$ to the non-inverting input 28. The input voltage $V_{in}$ is sampled in a non-inverting manner via the input stage 29 and the output stage 25. Since the output 12 of the buffer amplifier 9 constitutes a virtual ground connection, a fraction of the voltage at output 4 determined by the resistors $R_5$ and $R_6$ is fedback to the inverting input 3. This feedback voltage is amplified in an inverting manner via the input stage 20 and the output stage 25. Thus, the amplifier 1 functions as a conventional non-inverting negative feedback amplifier whose gain is substantially fully determined by the resistors $R_5$ and $R_6$.

Furthermore the bridge amplifier comprises a second amplifier 5 which is equal to the first amplifier 1 and which is provided with a third input stage 40 having a first input constituting the first non-inverting input 6 of the amplifier 5, a second input constituting the first inverting input 7 of the amplifier 5, and an output 43 which is connected to the input 46 of an output stage 45 whose output constitutes the output 8 of the amplifier 5, which output is connected via a resistor $R_8$ equal to resistor $R_5$ to the inverting input 7. This inverting input 7 is also connected via a resistor $R_9$, which is equal to resistor $R_6$, and the non-inverting input 6 is connected directly to the output 12 of the buffer amplifier 9. The inputs 6 and 7 and also the output 8 are therefore at half the supply voltage with respect to the d.c. voltage. The second amplifier 5 is also provided with a fourth input stage 50 having a first input constituting the second non-inverting input 49 of amplifier 5, a second input constituting the second inverting input 48 of the amplifier 5, and an output 51 which is connected to the input 46 of the output stage 45. The second non-inverting input 49 is connected via a resistor $R_{20}$, and the second inverting input 48 is connected via the resistors $R_{19}$ and $R_{21}$ to the terminal 60 carrying the reference voltage $V_{ref}$. The resistors $R_{19}$, $R_{20}$ nand $R_{21}$ are equal to the resistors $R_{15}$, $R_{16}$ and $R_{18}$, respectively. Furthermore, the second inverting input 48 is connected via the resistor $R_{19}$ to the connection terminal 13 for applying the input voltage $V_{in}$. The resistor $R_{21}$ then serves as an input resistor for this voltage to the second inverting input 48. The input voltage $V_{in}$ is amplified in an inverting manner via the input stage 50 and the output stage 45. A fraction of the output voltage determined by the resistors $R_8$ and $R_9$ is fed back to the first inverting input 7 and is subsequently amplified once more in an inverting manner via the input stage 40 and the output stage 46. Consequently, the amplifier 5 functions as a conventional inverting negative feedback amplifier, whose gain is substantially fully determined by the resistors $R_8$ and $R_9$.

With respect to the embodiment of FIG. 1, this embodiment has the following advantage. In the embodiment of FIG. 1 the input signal only traverses the first amplifier in the case of a non-inverting amplification, whereas the input signal traverses both the first and the second amplifier in the case of inverting amplification. Consequently phase differences occur, which may give rise to distortion of the output signal. Since in the embodiment of FIG. 3 the negative feedback of the first and second amplifiers 1 and 5 is effected through separate input stages, the input voltage $V_{in}$ cannot only be applied directly to the non-inverting amplifier 1, but also directly to the inverting amplifier 5. Consequently no phase difference occurs between the output signal at the output 4 of the first amplifier 1 and the output signal at the output 8 of the second amplifier 5 so that the output signal across the load $R_L$ cannot be distorted. The same advantage occurs with respect to the embodiment in which the input voltage is applied via a voltage inverter circuit to the non-inverting input of the second amplifier.

Figure 4:
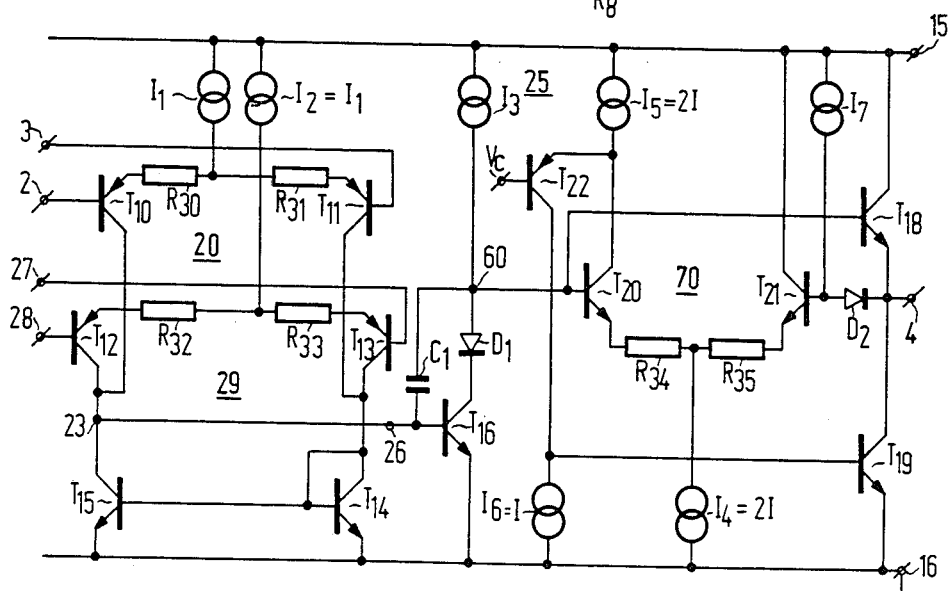
FIG. 4 shows an embodiment of an amplifier for the circuit of FIG. 3.

FIG. 4 shows a simplified diagram of a possible embodiment of the first amplifier 1 for the bridge amplifier of FIG. 3. The second amplifier 5 is constructed in a similar manner. The first input stage 20 comprises two transistors $T_{10}$ and $T_{11}$ whose emitters are connected via resistors $R_{30}$ and $R_{31}$ to the output of a current source $I_1$ which is connected to the positive supply voltage terminal 15. The collector of transistor $T_{10}$ is connected directly and the collector of transistor $T_{11}$ is connected by a current mirror including transistors $T_{14}$ and $T_{15}$ to the output 23 of the input stage 20. With the aid of the current mirror $T_{14}$, $T_{15}$ the differential collector currents flowing in the transistors $T_{10}$, $T_{11}$ due to the feedback voltage are converted into a single-ended output current which appears at output 23. The second input stage 29 is equal to the input stage 20 and comprises two transistors $T_{12}$ and $T_{13}$ whose emitters are connected via resistors $R_{32}$ and $R_{33}$ to the output of a current source $I_2$. The collectors of the transistors $T_{12}$ and $T_{13}$ are connected to the collectors of transistors $T_{10}$ and $T_{11}$, respectively. Consequently, the current mirror $T_{14}$, $T_{15}$ also serves for converting the differential collector currents flowing in the transistors $T_{12}$ and $T_{13}$ due to the input voltage $V_i$ into a single-ended output current to the output 23. This output 23 is connected to the input 26 of the output stage 25 which is provided with a so-called Miller stage comprising a transistor $T_{16}$ whose collector is connected via a level shifting diode $D_1$ to a load current source $I_3$. A frequency compensation capacitor $C_1$ is arranged between the output 60 and the input 26 of this Miller stage. This output 60 is connected to the base of a first output transistor $T_{18}$ which is arranged in series with a second output transistor $T_{19}$ between the positive supply voltage terminal 15 and ground terminal 16. The emitter of transistor $T_{18}$ and the collector of transistor $T_{19}$ are connected to the output 4 of the output stage 25. This output stage 25 also comprises a voltage current converter 70 which is formed by two transistors $T_{20}$ and $T_{21}$ whose emitters are connected via resistors $R_{34}$ and $R_{35}$ to the output of a current source $I_4=2I$. The base of transistor $T_{20}$ is connected to the output 60 of the Miller stage, while the base of transistor $T_{21}$ is connected via a diode $D_2$ to the output 4 and via a current source $I_7$ to the positive supply voltage terminal 15. The collector of transistor $T_{20}$ is connected via a current source $I_5=2I$ to the positive supply voltage terminal 15 and also to the emitter of a current follower transistor $T_{22}$ whose base carries a reference voltage $V_c$ and whose collector is connected via a current source $I_6=I$ to ground terminal 16 and also to the base of output transistor $T_{19}$. The current source $I_7$ and diode $D_2$ ensure that a small quiescent current flows through the transistors $T_{18}$ and $T_{19}$ so that these transistors are set in class-AB. The change of the base emitter voltage of transistor $T_{18}$ occurring upon driving by the Miller stage is converted by the voltage current converter 70 into a drive current with which transistor $T_{19}$ is driven in phase-opposition with transistor $T_{18}$.

In addition to the embodiment shown in FIG. 4, the first and the second amplifier may be formed in any manner other than the one shown, provided that they have an inverting input which gets a low impedance due to negative feedback, and a push-pull output stage.

The invention is not limited to the embodiments shown, but many variations within the scope of the invention are feasible to those skilled in the art.

What is claimed is:

1. A bridge amplifier connected between two connection terminals of an asymmetrical supply voltage comprising:
    a voltage divider connected between said connection terminals having a tap for supplying substantially one half of said supply voltage;
    a buffer amplifier having an input connected to said voltage divider tap, and an output;
    a first amplifier having a first amplifier non-inverting input coupled to said voltage divider tap and connected to an input signal terminal, an inverting input, and an output connected to said inverting input through a resistor and also connected to one terminal of a load; and
    a second amplifier having a non-inverting input which is coupled to said voltage divider tap, an inverting input, and an output connected through a resistor to said inverting input, and connected to a second terminal of said load; and
    means for connecting said output of said buffer amplifier to said inverting input of said first amplifier and said inverting input of said second amplifier.

2. A bridge amplifier as claimed in claim 1, wherein the non-inverting input of the first amplifier receives an input signal.

3. A bridge amplifier as claimed in claim 2, wherein the inverting input of the second amplifier is coupled to a tap on a second voltage divider arranged across the output of the first amplifier.

4. A bridge amplifier connected between two connection terminals of an asymmetrical supply voltage comprising:
    a voltage divider connected between said connection terminals having a tap for supplying substantially one half of said supply voltage;
    a buffer amplifier having an input connected to said voltage divider tap, and a buffer amplifier output;
    a first amplifier having a first amplifier non-inverting input coupled to said buffer amplifier output, a first amplifier inverting input, and a first amplifier output connected to said first amplifier inverting input through a resistor and also connected to one terminal of the load, said first amplifier comprising
    a first input stage having a first input constituting the first amplifier non-inverting input, a second input constituting the first amplifier inverting input, and an output connected to the input of a first output stage having an output constituting said first amplifier output, and a second input stage having a first input constituting a second non-inverting input of the first amplifier and connected to an input signal terminal, a second input constituting a second inverting input of the first amplifier and connected to a reference voltage terminal, and an output connected to the input of the first amplifier output stage;
    a second amplifier having a non-inverting input coupled to the buffer amplifier output, an inverting input connected to the buffer amplifier output through resistance means, and a second amplifier output connected through a resistor to said inverting input and connected to a second terminal of said load, said second amplifier comprising
    a third input stage having a first input constituting the non-inverting input of the second amplifier, a second input constituting the inverting input of the second amplifier, and an output connected to the input of an output stage having an output constituting the second amplifier output,
    a fourth input stage having a first input constituting a second non-inverting input of the second amplifier and coupled to the reference voltage terminal, a second input constituting a second inverting input of the second amplifier and connected to the input signal terminal, and an output connected to the input of the second output stage.

5. A bridge amplifier as claimed in claim 4, wherein the first, second, third and fourth input stages are each constituted by a differential amplifier.

* * * * *